(12) United States Patent
Wang et al.

(10) Patent No.: US 10,561,028 B2
(45) Date of Patent: Feb. 11, 2020

(54) FLEXIBLE DISPLAY

(71) Applicant: BOE TECHNOLOGY GROUP CO., LTD., Beijing (CN)

(72) Inventors: Zifeng Wang, Beijing (CN); Yan Ren, Beijing (CN); Lei Cao, Beijing (CN); Hailan Jin, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/333,488

(22) PCT Filed: May 4, 2018

(86) PCT No.: PCT/CN2018/085614
§ 371 (c)(1),
(2) Date: Mar. 14, 2019

(87) PCT Pub. No.: WO2018/205888
PCT Pub. Date: Nov. 15, 2018

(65) Prior Publication Data
US 2019/0261520 A1    Aug. 22, 2019

(30) Foreign Application Priority Data

May 10, 2017    (CN) .......................... 2017 1 0324778

(51) Int. Cl.
*H05K 5/00*    (2006.01)
*H05K 7/00*    (2006.01)
(Continued)

(52) U.S. Cl.
CPC ........... *H05K 5/0017* (2013.01); *F16C 13/00* (2013.01); *H05K 5/0217* (2013.01); *H05K 5/0221* (2013.01)

(58) Field of Classification Search
CPC ....................................................... H05K 5/00
See application file for complete search history.

(56) References Cited

U.S. PATENT DOCUMENTS 7,581,578 B2    9/2009  Coenraets
9,206,009 B2 *  12/2015 Iwatsuki ................ B65H 43/08
(Continued)

FOREIGN PATENT DOCUMENTS

CN    101124373 A    2/2008
CN    103560101 A    2/2014
(Continued)

OTHER PUBLICATIONS

International Search Report of PCT/CN2018/085614 in Chinese, dated Jul. 18, 2018, with English translation.
(Continued)

*Primary Examiner* — Jerry Wu
(74) *Attorney, Agent, or Firm* — Collard & Roe, P.C.

(57) ABSTRACT

A flexible display is disclosed. The flexible display includes: a roller, an external wall of the roller is provided with an opening; a first rotating shaft rotatably connected with the roller; and a flexible display screen configured to protrude from the roller or withdraw into the roller through the opening, the flexible display screen has a movable first end and a second end fixed at the first rotating shaft, the first end and the second end are opposite to each other.

19 Claims, 3 Drawing Sheets

(51) Int. Cl.
  *F16C 13/00*   (2006.01)
  *H05K 5/02*   (2006.01)

(56) References Cited

U.S. PATENT DOCUMENTS

| | | | |
|---|---|---|---|
| 9,475,270 | B2 | 10/2016 | Xie et al. |
| 9,743,537 | B2 * | 8/2017 | Kim ..................... G06F 1/1652 |
| 2018/0017994 | A1 | 1/2018 | Xu et al. |
| 2019/0261520 | A1 | 8/2019 | Wang et al. |

FOREIGN PATENT DOCUMENTS

| | | |
|---|---|---|
| CN | 104851366 A | 8/2015 |
| CN | 106952581 A | 7/2017 |

OTHER PUBLICATIONS

Notice of Transmittal of the International Search Report of PCT/CN2018/085614 in Chinese, dated Jul. 18, 2018.
Written Opinion of the International Searching Authority of PCT/CN2018/085614 in Chinese, dated Jul. 18, 2018 with English translation.

\* cited by examiner

FLEXIBLE DISPLAY

CROSS REFERENCE TO RELATED APPLICATIONS

This application is the National Stage of PCT/CN2018/085614 filed on May 4, 2018, which claims priority under 35 U.S.C. § 119 of Chinese Application No. 201710324778.1 filed on May 10, 2017, the disclosure of which is incorporated by reference.

TECHNICAL FIELD

Embodiments of the present disclosure relate to a flexible display.

BACKGROUND

With the continuous development of display technologies, flexible display has been gained more and more popularities among users. The flexible display is mainly characterized by that, a display screen itself is flexible in both of a display state and a non-display state, which on one aspect facilitates folding the flexible display under the non-display state and on the other aspect achieves displaying function when the display screen is bent into different shapes according to different demands.

However, when the flexible display in a bent state is unfolded again for use, a display surface thereof may be not quite flat, which may affect the display effect of the display.

SUMMARY

Embodiments of the present disclosure adopt technical solutions as below.

A flexible display, including a roller, an external wall of the roller being provided with an opening; a first rotating shaft rotatably connected with the roller; and a flexible display screen configured to protrude from the roller or withdraw into the roller through the opening, the flexible display screen having a movable first end and a second end fixed at the first rotating shaft, the first end and the second end being opposite to each other.

In the flexible display provided by the embodiment of the present disclosure, with the arrangement of the roller and the first rotating shaft, the flexible display screen may be conveniently folded and unfolded. When it needs to unfold the flexible display screen, the user may manually pull the first end of the flexible display screen, so as to apply a first pulling force to the flexible display screen; at this time, since the second end of the flexible display screen is connected with the first rotating shaft, the first rotating shaft may apply a second pulling force to the flexible display screen in a direction opposite to that of the first pulling force. Under the action of the first pulling force and the second pulling force, the flexible display screen is flattened.

Therefore, the flexible display provided by the embodiment of the present disclosure may facilitate the convenience of folding the flexible display screen, increase the flatness of the unfolded flexible display screen, and improve the display effect of the flexible display.

In some optional embodiments, the flexible display further includes: at least one second rotating shaft rotatably connected with the roller; and a frame disposed on at least one side edge of the flexible display screen; the frame has a first end fixedly connected with the first end of the flexible display screen and a second end fixed at the second rotating shaft, and the frame is configured to flatten the side edge where the frame is located when the flexible display screen protrudes from the roller, and is configured to be separated from the flexible display screen and rolled onto the second rotating shaft when the flexible display screen withdraws into the roller; the side edge is an edge of the flexible display screen except the first end and the second end.

In some optional embodiments, every side edge of the flexible display screen is provided with the frame.

In some optional embodiments, the frame includes: a plurality of first flattening units rotatable with each other; and a locking mechanism configured to lock the plurality of first flattening units at a predetermined position to form the frame described above.

In some optional embodiments, two opposite sides of each of the first flattening units are provided with a buckling groove and a buckle, respectively; and any adjacent two first flattening units are connected in a snap-fit manner through the buckling groove and the buckle.

In some optional embodiments, the locking mechanism includes a plurality of second flattening units each matched with one of the plurality of first flattening units in a snap-fit manner; two second rotating shafts are provided, and the first flattening unit and the second flattening unit are rolled onto one of the second rotating shafts, respectively.

In some optional embodiments, two opposite sides of each of the second flattening units are provided with a buckling groove and a buckle, respectively; and any adjacent two second flattening units are connected in a snap-fit manner through the buckling groove and the buckle.

In some optional embodiments, each of the first flattening units is provided with at least one first protrusion, each of the second flattening units is provided with at least one first groove which is matched in one-to-one correspondence with the at least one first protrusion on the corresponding first flattening unit; or each of the first flattening units is provided with at least one first groove, each of the second flattening units is provided with at least one first protrusion which is matched in one-to-one correspondence with the at least one first groove on the corresponding first flattening unit.

In some optional embodiments, an interior of the roller is provided with a first guide rail and a second guide rail which are parallel to each other; a press-fit clearance is formed between the first guide rail and the second guide rail; and the first guide rail and the second guide rail are configured to assemble the flexible display screen, the first flattening unit and the second flattening unit within the press-fit clearance together in a press-fit manner.

In some optional embodiments, each of the first flattening units is provided with a second protrusion configured to flatten the side edge of the flexible display screen; each of the second flattening units is provided with a third protrusion corresponding to the second protrusion on the corresponding first flattening unit.

In some optional embodiments, the flexible display further includes a telescopic rod fixedly connected with the first end of the flexible display screen; the telescopic rod is configured to close the opening when the flexible display screen is rolled up.

In some optional embodiments, an interior of the roller is provided with a separating unit configured to separate the first flattening unit and the second flattening unit connected in a snap-fit manner from each other.

In some optional embodiments, the separating unit is a separating block, a middle part of the separating block is provided with a through hole which allows the flexible display screen to pass there-through; the separating block is fixed with respect to the roller, and the separating block has two fourth protrusions which are raised towards the first flattening unit and the second flattening unit, respectively; each of the first flattening units and each of the second flattening units are provided with a concave part, respectively; when adjacent two first flattening units are connected with adjacent two second flattening units in a snap-fit manner, respectively, concave parts of the adjacent two first flattening units form a closed second groove to limit one of the fourth protrusions of the separating block, concave parts of the adjacent two second flattening units form a closed third groove to limit the other one of the fourth protrusions of the separating block.

In some optional embodiments, a material of the first flattening unit and the second flattening unit is plastic.

BRIEF DESCRIPTION OF THE DRAWINGS

Hereinafter, the drawings accompanying embodiments of the present disclosure are simply introduced so that those ordinary skilled in the art can understand the present disclosure more clearly. In the drawings.

DETAILED DESCRIPTION

In order to make objects, technical details and advantages of the embodiments of the disclosure apparent, technical solutions according to the embodiments of the present disclosure will be described clearly and completely as below in conjunction with the accompanying drawings of embodiments of the present disclosure. Apparently, the described embodiments are only a part of but not all of exemplary embodiments of the present disclosure. Based on the described embodiments of the present disclosure, various other embodiments can be obtained by those of ordinary skill in the art without creative labor and those embodiments shall fall into the protection scope of the present disclosure.

Unless otherwise defined, the technical terminology or scientific terminology used herein should have the same meaning as commonly understood by one of ordinary skill in the art to which this disclosure belongs. Likewise, terms like "first," "second," etc., which are used in the description and the claims of the present application for disclosure, are not intended to indicate any sequence, amount or importance, but distinguish various components. The phrases "connect", "connected", etc., are not intended to define a physical connection or mechanical connection, but may include an electrical connection, directly or indirectly. "On," "under," "left," "right" or the like is only used to describe a relative positional relationship, and when the absolute position of a described object is changed, the relative positional relationship might also be changed accordingly.

Figure 1:
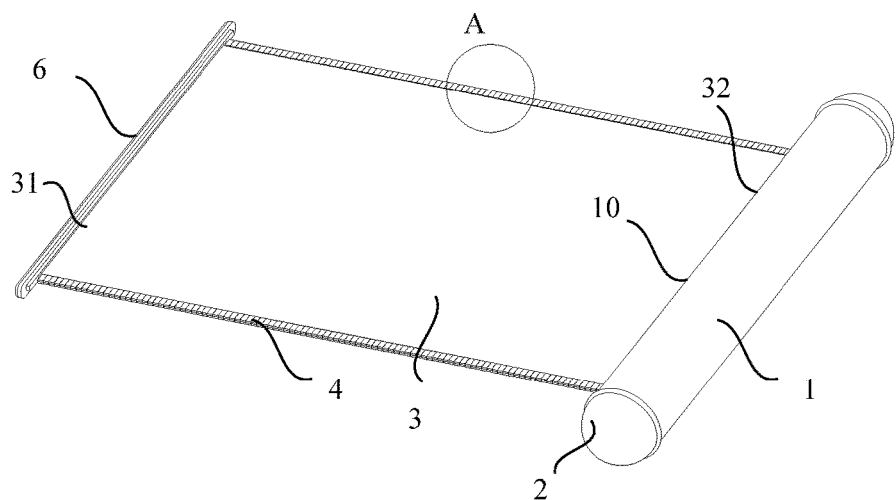
FIG. 1 is a structural diagram of a flexible display provided by an embodiment of the present disclosure.
Figure 2:
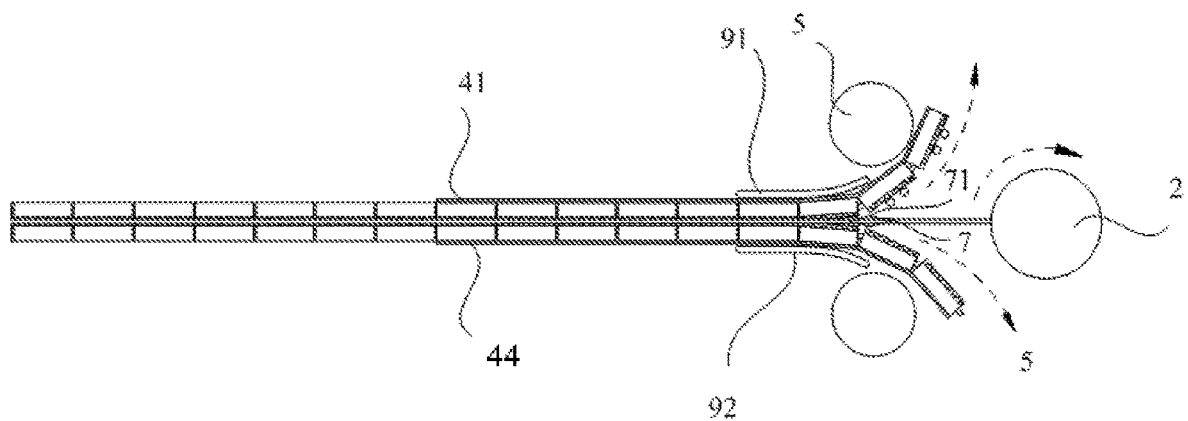
FIG. 2 is a structural diagram illustrating an interior of a roller of the flexible display provided by an embodiment of the present disclosure.

As illustrated in FIG. 1 and FIG. 2, an embodiment of the present disclosure provides a flexible display. The flexible display includes: a roller 1, an external wall of the roller 1 is provided with an opening 10; a first rotating shaft 2 rotatably connected with the roller 1; and a flexible display screen 3 having a movable first end 31 and a second end 32 fixed at the first rotating shaft 2, the flexible display screen 3 is capable of protruding from the roller 1 or withdrawing into the roller 1 through the opening 10 of the roller 1.

In the flexible display provided by the embodiment of the present disclosure, with the arrangement of the roller 1 and the first rotating shaft 2, the flexible display screen 3 can be folded and unfolded conveniently.

The flexible display screen 3 may be rolled up by directly winding onto the first rotating shaft 2 with respect to an axial line which is coincident with an axial line of the first rotating shaft 2; the flexible display screen 3 may also be rolled up and received at an inner wall of the roller 1 by driving the first rotating shaft 2 to rotate, and the flexible display screen 3 is rolled about an axial line which is coincident with an axial line of the roller 1.

When it needs to unfold the flexible display screen 3, an user may manually pull the movable first end of the flexible display screen 3 to apply a first pulling force to the flexible display screen 3; at this time, since the second end of the flexible display screen 3 is fixedly connected with the first rotating shaft 2, the first rotating shaft 2 would apply a second pulling force to the flexible display screen 3 in a direction opposite to that of the first pulling force; under the action of the first pulling force and the second pulling force, the flexible display screen 3 may be pulled to be flattened.

As a result, the flexible display provided by the embodiment of the present disclosure can facilitate the convenience of folding the flexible display screen, increase the flatness of the unfolded flexible display screen, and improve the display effect of the flexible display.

In an example, as illustrated in FIG. 2, the flexible display further includes: at least one second rotating shaft 5 rotatably connected with the roller 1; and a frame 4 disposed on at least one side edge of the flexible display screen 3, the frame 4 has a first end fixedly connected with the first end 31 of the flexible display screen 3 and a second end fixed at the second rotating shaft 5; the frame 4 is configured to flatten the side edge where the frame is located when the flexible display screen 3 protrudes from the roller 1 and is configured to be separated from the flexible display screen 3 and rolled onto the second rotating shaft 5 when the flexible display screen 3 withdraws into the roller 1. With the arrangement of the frame 4, the flexible display screen 3 protruded out of the roller 1 may be flattened, so that a strength of the edge of the flexible display screen 3 is enhanced; moreover, when the flexible display screen 3 withdraws into the roller 1, the frame 4 may be separated from the flexible display screen 3 so that a flexibility of the edge of the flexible display screen 3 may be restored, which is convenient for withdrawing the flexible display screen 3 and allows the frame 4 to be rolled onto the second rotating shaft 5 along therewith; in this way, the flexible display is easy to carry.

The side edge of the flexible display screen described above refers to an edge of the flexible display screen except the first end and the second end. The frame 4 described above may be formed by using a memory alloy material or by using a material like measuring tape. The flexible display screen 3 may be withdrawn by curling up and may also be withdrawn by folding up, and the like.

In some embodiments, the first rotating shaft 2 and the second rotating shaft 5 may be rotated at a same velocity. The rotation of the first rotating shaft 2 and the second rotating shaft 5 may be driven manually or may be driven by devices. When the first rotating shaft 2 and the second rotating shaft 5 are driven by devices, they may be driven by using a same driving motor, and may also be driven by different driving motors which are controlled separately. Correspondingly, in order to facilitate controlling the driving motor to be turned on and turned off by the user, the roller 1 may be provided with a control switch. The control switch may be a mechanical switch or a touch-control switch.

In order to further increase the flatness of the flexible display screen 3 protruded out of the roller 1 and to further improve the display effect of the flexible display, every side edge of the flexible display screen 3 is provided with the frame 4.

Figure 3:
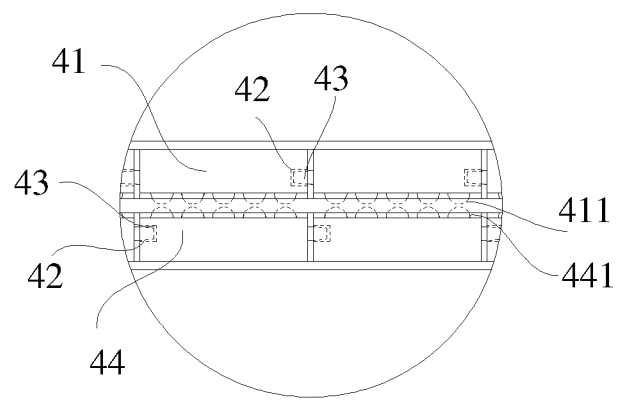
FIG. 3 is an enlarged view illustrating a portion A of the flexible display illustrated in FIG. 1.
Figure 4:
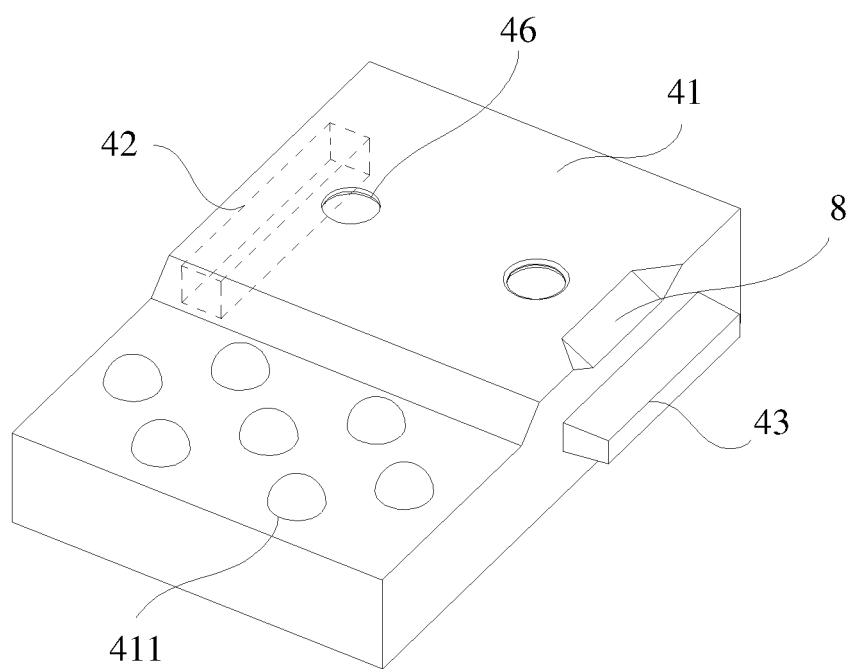
FIG. 4 is a structural diagram of a first flattening unit of the flexible display provided by an embodiment of the present disclosure.

In an example, as illustrated in FIG. 3 and FIG. 4, the frame 4 includes a plurality of first flattening units 41 rotatable with respect to each other, and a locking mechanism configured to lock the first flattening unit 41 at a predetermined position to form the frame 4.

Optionally, two opposite sides of each of the first flattening units 41 are provided with a buckling groove 42 and a buckle 43, respectively. Any adjacent two first flattening units 41 are connected in a snap-fit manner through the buckle groove 42 and the buckle 43. In order to facilitate rolling up the frame 4, the buckle 43 may be configured as flexible, and the cooperation between the buckle 43 and the buckle groove 42 may be configured as a clearance fit, so that a portion where the adjacent two first flattening units 41 are connected in a snap-fit is easy to be bent.

The locking mechanism described above may be achieved in various ways. Optionally, as illustrated in FIG. 3, the locking mechanism includes a plurality of second flattening units 44 each matched with one of the plurality of first flattening units 41 in a snap-fit manner. For example, when the number of the second rotating shaft 5 is configured as 2, the plurality of first flattening units 41 may be rolled onto one of the two second rotating shafts 5, the plurality of second flattening units 44 may be rolled onto the other one of the two second rotating shafts 5, and the first flattening units 41 may be disposed in one-to-one correspondence with the second flattening units 44.

Figure 5:
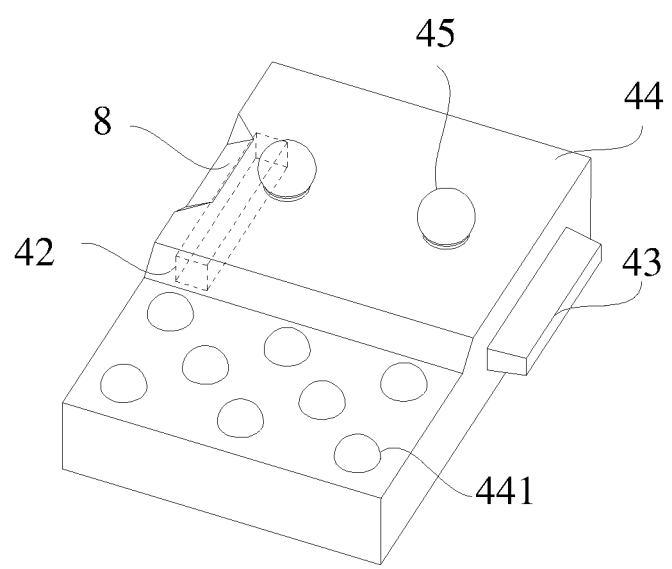
FIG. 5 is a structural diagram of a second flattening unit of the flexible display provided by an embodiment of the present disclosure.

In an example, as illustrated in FIG. 5, two opposite sides of each of the second flattening units 44 are provided with a buckling groove 42 and a buckle 43, respectively. Any adjacent two second flattening units 44 are connected in a snap-fit manner through the buckle groove 42 and the buckle 43. Similarly, in order to facilitate rolling up the frame 4, the buckle 43 may be configured as flexible, and the cooperation between the buckle 43 and the buckle groove 42 may be configured as a clearance fit, so that a portion where the adjacent two second flattening units 44 are connected in a snap-fit is easy to be bent.

In order to facilitate fixing the first flattening unit 41 with the second flattening unit 44, as illustrated in FIG. 4 and FIG. 5, each of the first flattening units 41 is provided with at least one first protrusion 45, and each of the second flattening units 44 is provided with at least one first groove 46 which is matched in one-to-one correspondence with the at least one first protrusion 45; or, each of the first flattening units 41 is provided with at least one first groove 46, and each of the second flattening units 44 is provided with at least one first protrusion 45 which is matched in one-to-one correspondence with the at least one first groove 46.

With the arrangement of the protrusion and the groove, the first flattening unit 41 and the second flattening unit 44 disposed in correspondence with each other may be press-fitted and locked with each other. Particular shapes of the first protrusion and the first groove may be configured by those skilled in the art according to actual demands.

In order to facilitate fixing the first flattening unit 41 with the second flattening unit 44 in a press-fit manner, as illustrated in FIG. 2, an interior of the roller 1 is provided with a first guide rail 91 and a second guide rail 92 disposed in parallel, and a fit clearance is formed between the first guide rail 91 and the second guide rail 92. The first guide rail 91 and the second guide rail 92 are configured to assemble the flexible display screen 3, the first flattening units 41 and the second flattening units 44 within the fit clearance together in a press-fit manner. Particular shapes and lengths of the first guide rail 91 and the second guide rail 92 may be configured according to actual demands. In order to prevent the first guide rail 91 and the second guide rail 92 from damaging the first flattening units 41 and the second flattening units 44 when press-fitting the first flattening units 41 with the second flattening units 44, surfaces of the first guide rail 91 and the second guide rail 92 for press-fit may be configured as smooth surfaces.

In an example, as illustrated in FIG. 3, each of the first flattening units 41 is provided with at least one second protrusion 411 configured to flatten the side edge of the flexible display screen 3, each of the second flattening units 44 is provided with at least one third protrusion 441 disposed in one-to-one correspondence with the at least one second protrusion 411, so as to facilitate flattening the edge of the flexible display screen 3. In order to prevent the second protrusion 411 and the third protrusion 441 from generating a scratch on the flexible display screen 3, preferably, surfaces of the second protrusion 411 and the third protrusion 441 contacting with the flexible display screen 3 are configured as smooth, curved surfaces.

The first end 31 of the flexible display screen 3 can protrude out of the roller 1 through the opening in the external wall of the roller 1. As a result, in an example, the flexible display may further include a telescope rod 6 fixedly connected with the first end 31 of the flexible display screen 3, as illustrated in FIG. 1. When the flexible display screen 3 is rolled up, the telescope rod 6 may cover the opening. On one aspect, the design of the telescope rod 6 facilitates pulling the flexible display screen 3 out of the roller 1; and on the other aspect, when the flexible display screen 3 withdraws into the roller 1, the telescope rod 6 may cover the opening in the roller 1 so as to prevent external dusts, moisture and the like from entering the roller 1, which can improve a closure property of the roller 1.

In an example, as illustrated in FIG. 2, an interior of the roller 1 is further provided with a separating unit configured to separate the first flattening unit 41 and the second flattening unit 44 connected in a snap-fit manner from each other. The arrangement of the separating unit facilitates separating the first flattening unit 41 from the second flattening unit 44, which allows the rigid edge of the flexible display screen 3 obtained by the connection between the first flattening units, the connection between the second flattening units and the connection between the first flattening unit and the second flattening unit to be restored to a flexible edge. Subsequently, the two second rotating shafts 5 may roll up the first flattening unit 41 and the second flattening unit, respectively.

The separating unit described above may be achieved in various ways. Optionally, as illustrated in FIG. 2, the separating unit may be a separating block 7, and a middle part of the separating block 7 is provided with a through hole which allows the flexible display screen 3 to pass there-through. The separating block 7 is fixed with respect to the roller 1, and is provided with two fourth protrusions 71 which are raised towards the first flattening unit 41 and the second flattening unit 44, respectively. Correspondingly, each of the first flattening units 41 and each of the second flattening units 44 may be provided with a concave part 8 (not illustrated in FIG. 2, please refer to FIG. 4), respectively. When adjacent two first flattening units 41 are connected with adjacent two second flattening units 44 in a snap-fit manner, respectively, concave parts 8 of the adjacent two first flattening units 41 form a closed second groove to limit one of the fourth protrusions 71 of the separating block 7, concave parts 8 of the adjacent two second flattening units 44 form a closed third groove to limit the other one of the fourth protrusions 71 of the separating block 7. With the cooperation between the separating block 7 and the second groove delimited by the adjacent two first fattening units 41, and the cooperation between the separating block 7 and the third groove delimited by the adjacent two second flattening units 44, the first flattening unit 41 may be separated from the second flattening unit 44.

The first flattening unit 41 and the second flattening unit 44 described above may be formed of various materials. Optionally, the material of forming the first flattening unit 41 and the second flattening unit 44 is plastic. The plastic possesses certain hardness and meanwhile is convenient to be rolled up.

When the first rotating shaft 2 and the second rotating shaft 5 are rotated manually and the flexible display screen 3 is folded in a curled manner, as illustrated in FIG. 2, the user manually pulls the telescope rod 6, then the flexible display screen 3 that has been curled inside the roller 1 protrudes out of the roller 1 by means of an anticlockwise or clockwise rotation of the second rotating shaft 5; at the same time, the first flattening unit 41 and the second flattening unit 44 are also unfolded with the drive of the rotation of the second rotating shaft 5 on which the first flattening unit 41 and the second flattening unit 44 are winded, respectively; when the first flattening unit 41, the flexible display screen 3 and the second flattening unit 44 pass through the clearance between the first guide rail 91 and the second guide rail 92, they are assembled together in a press-fit manner by the first guide rail 91 and the second guide rail 92 so as to form a rigid frame 4; on the contrary, when it needs to roll up the flexible display screen 3, the first flattening unit 41 and the second flattening unit 44 connected in a snap-fit manner that pass through the separating block 7 would be separated from each other by the separating block 7, then the first flattening unit 41 and the second flattening unit 44 are rolled up by the first rotating shaft 2 and the flexible display screen 3 is rolled up by the second rotating shaft 5.

In the embodiments of the present disclosure, the flexible display described above may be a computer, a mobile phone or other electronic devices.

Obviously, various modifications and variations may be made to the embodiments of the present disclosure by those skilled in the art without departing from the spirit and scope of the present disclosure. In this way, if these modifications and variations fall within the scope of the claims and equivalents thereof, the present disclosure is intended to cover all these modifications and variations.

The present application claims the benefits of Chinese patent application No. 201710324778.1 filed with the SIPO on May 10, 2017 under the title of "FLEXIBLE DISPLAY", and the contents of the above-mentioned Chinese patent application is fully incorporated herein by reference.

What is claimed is:

1. A flexible display, comprising: a roller, an external wall of the roller being provided with an opening; a first rotating shaft rotatably connected with the roller; and a flexible display screen configured to protrude from the roller or withdraw into the roller through the opening, the flexible display screen having a movable first end and a second end fixed at the first rotating shaft, the first end and the second end being opposite to each other; and at least one second rotating shaft rotatably connected with the roller; a frame on at least one side edge of the flexible display screen, wherein the frame has a first end fixedly connected with the first end of the flexible display screen and a second end fixed at the second rotating shaft, and the frame is configured to flatten the side edge where the frame is located upon the flexible display screen protruding from the roller, and is configured to be separated from the flexible display screen and rolled onto the second rotating shaft upon the flexible display screen withdrawing into the roller, wherein the side edge is an edge of the flexible display screen except the first end and the second end.

2. The flexible display according to claim 1, wherein every side edge of the flexible display screen is provided with the frame.

3. The flexible display according to claim 2, wherein the frame comprises:
   a plurality of first flattening units rotatable with each other; and
   a locking mechanism configured to lock the plurality of first flattening units at a predetermined position to form the frame.

4. The flexible display according to claim 3, wherein two opposite sides of each of the first flattening units are provided with a buckling groove and a buckle, respectively, and
   any adjacent two first flattening units are connected in a snap-fit manner through the buckling groove and the buckle.

5. The flexible display according to claim 4, wherein the locking mechanism comprises a plurality of second flattening units each matched with one of the plurality of first flattening units in a snap-fit manner,
   two second rotating shafts are provided, and the first flattening unit and the second flattening unit are rolled onto one of the second rotating shafts, respectively.

6. The flexible display according to claim 5, wherein two opposite sides of each of the second flattening units are provided with a buckling groove and a buckle, respectively, and
   any adjacent two second flattening units are connected in a snap-fit manner through the buckling groove and the buckle.

7. The flexible display according to claim 5, wherein each of the first flattening units is provided with at least one first protrusion, each of the second flattening units is provided with at least one first groove which is matched in one-to-one correspondence with the at least one first protrusion on the corresponding first flattening unit; or
   each of the first flattening units is provided with at least one first groove, each of the second flattening units is provided with at least one first protrusion which is matched in one-to-one correspondence with the at least one first groove on the corresponding first flattening unit.

8. The flexible display according to claim 5, wherein an interior of the roller is provided with a first guide rail and a second guide rail which are parallel to each other,
   a press-fit clearance is formed between the first guide rail and the second guide rail, and the first guide rail and the second guide rail are configured to assemble the flexible display screen, the first flattening unit and the second flattening unit within the press-fit clearance together in a press-fit manner.

9. The flexible display according to claim 5, wherein each of the first flattening units is provided with a second protrusion configured to flatten the side edge of the flexible display screen,
each of the second flattening units is provided with a third protrusion corresponding to the second protrusion on the corresponding first flattening unit.

10. The flexible display according to claim 5, further comprising a telescopic rod fixedly connected with the first end of the flexible display screen,
the telescopic rod is configured to close the opening upon the flexible display screen being rolled up.

11. The flexible display according to claim 5, wherein an interior of the roller is further provided with a separating unit configured to separate the first flattening unit and the second flattening unit connected in a snap-fit manner from each other.

12. The flexible display according to claim 11, wherein the separating unit is a separating block, a middle part of the separating block is provided with a through hole which allows the flexible display screen to pass there-through, the separating block is fixed with respect to the roller, and the separating block has two fourth protrusions which are raised towards the first flattening unit and the second flattening unit, respectively;
each of the first flattening units and each of the second flattening units are provided with a concave part, respectively,
upon adjacent two first flattening units being connected with adjacent two second flattening units in a snap-fit manner, respectively, concave parts of the adjacent two first flattening units form a closed second groove to limit one of the fourth protrusions of the separating block, concave parts of the adjacent two second flattening units form a closed third groove to limit the other one of the fourth protrusions of the separating block.

13. The flexible display according to claim 12, wherein a material of the first flattening unit and the second flattening unit is plastic.

14. The flexible display according to claim 6, wherein an interior of the roller is further provided with a separating unit configured to separate the first flattening unit and the second flattening unit connected in a snap-fit manner from each other.

15. The flexible display according to claim 7, wherein an interior of the roller is further provided with a separating unit configured to separate the first flattening unit and the second flattening unit connected in a snap-fit manner from each other.

16. The flexible display according to claim 8, wherein an interior of the roller is further provided with a separating unit configured to separate the first flattening unit and the second flattening unit connected in a snap-fit manner from each other.

17. The flexible display according to claim 9, wherein an interior of the roller is further provided with a separating unit configured to separate the first flattening unit and the second flattening unit connected in a snap-fit manner from each other.

18. The flexible display according to claim 10, wherein an interior of the roller is further provided with a separating unit configured to separate the first flattening unit and the second flattening unit connected in a snap-fit manner from each other.

19. The flexible display according to claim 14, wherein the separating unit is a separating block, a middle part of the separating block is provided with a through hole which allows the flexible display screen to pass there-through, the separating block is fixed with respect to the roller, and the separating block has two fourth protrusions which are raised towards the first flattening unit and the second flattening unit, respectively;
each of the first flattening units and each of the second flattening units are provided with a concave part, respectively,
upon adjacent two first flattening units being connected with adjacent two second flattening units in a snap-fit manner, respectively, concave parts of the adjacent two first flattening units form a closed second groove to limit one of the fourth protrusions of the separating block, concave parts of the adjacent two second flattening units form a closed third groove to limit the other one of the fourth protrusions of the separating block.

\* \* \* \* \*